United States Patent
Lauffer et al.

[11] Patent Number: 5,867,898
[45] Date of Patent: Feb. 9, 1999

[54] METHOD OF MANUFACTURE MULTILAYER CIRCUIT PACKAGE

[75] Inventors: John Matthew Lauffer, Waverly; David John Russell, Apalachin, both of N.Y.; James Jens Hansen, Huntington, Ind.

[73] Assignee: International Business Machines Corporation, Armonk, N.Y.

[21] Appl. No.: 811,077

[22] Filed: Mar. 3, 1997

Related U.S. Application Data

[62] Division of Ser. No. 429,612, Apr. 27, 1995, Pat. No. 5,670,750.

[51] Int. Cl.[6] ............................................. H05K 3/34
[52] U.S. Cl. .......................... 29/840; 29/846; 29/852; 174/260; 174/263; 361/768
[58] Field of Search ...................... 29/852, 846, 830, 29/829, 853, 832; 174/260, 263; 361/768

[56] References Cited

U.S. PATENT DOCUMENTS

| | | |
|---|---|---|
| 4,528,064 | 7/1985 | Ohsawa et al. ................ 29/852 X |
| 4,893,404 | 1/1990 | Shirahata et al. .................... 29/846 |
| 5,200,026 | 4/1993 | Okabe . |
| 5,227,013 | 7/1993 | Kumar . |
| 5,258,094 | 11/1993 | Furvi et al. ..................... 29/852 X |
| 5,263,243 | 11/1993 | Taneda et al. .................. 29/852 X |
| 5,729,893 | 3/1998 | Tanifuji et al. ................. 29/852 X |

FOREIGN PATENT DOCUMENTS 572232  12/1993  European Pat. Off. ............. 29/830

*Primary Examiner*—Carl J. Arbes
*Attorney, Agent, or Firm*—Douglas M. Clarkson

[57] ABSTRACT

A metal carrier has a dielectric material with a thickness of less than 0.004 inch and electrical voltage insulation characteristics of at least 2500 volts formed on a surface. A donut configured land defines at least one via or opening for removing dielectric material selectively. Reflow solder is used to form electrical interconnections, and the vias provide thermal dissipation sufficient to conform to safety requirements.

8 Claims, 2 Drawing Sheets

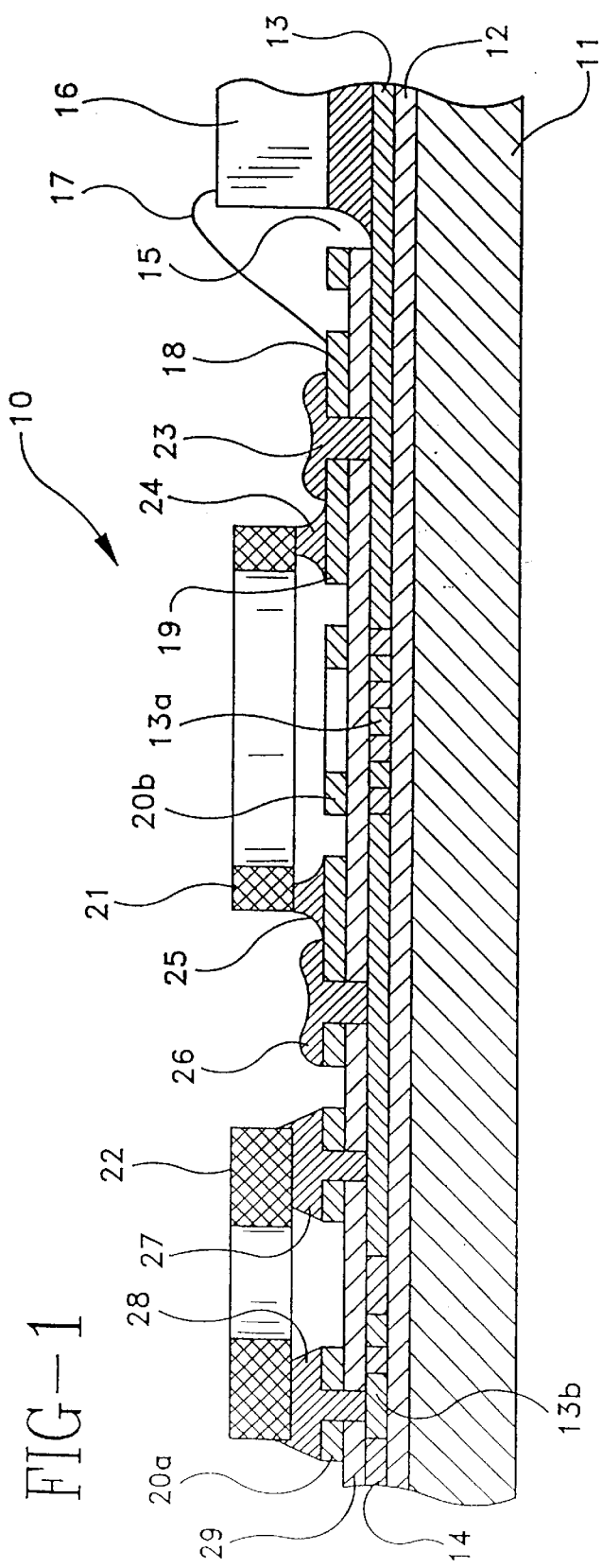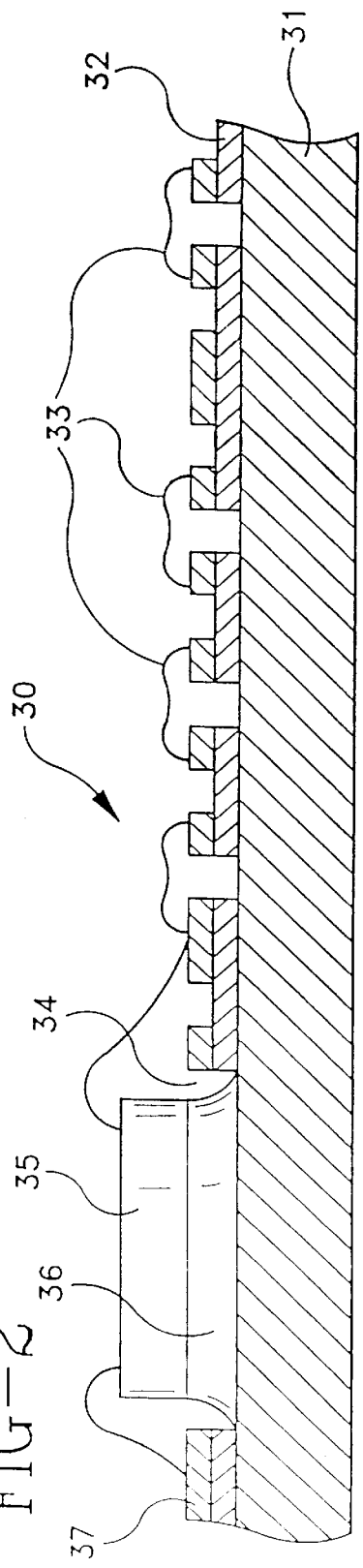

METHOD OF MANUFACTURE MULTILAYER CIRCUIT PACKAGE

This is a division of U.S. Ser. No. 08/429,612 Apr. 27, 1995 now U.S. Pat. No. 5,670,750 issued Sep. 23, 1997.

BACKGROUND OF THE INVENTION

1. Field of the Invention.

The present invention, generally, relates to electrical circuit cards and their manufacture.

Circuit cards today are still called "printed circuit boards" even though they seldom are printed. Regardless of how they are made, they must conform to stringent safety requirements concerning their operating voltages, dielectric breakdown voltages and ability to dissipate heat during operating conditions.

When these safety requirements call for ability to operate under voltages of at least 2500 volts, this dictates minimum dielectric thicknesses, which often present heat dissipation problems. Of course, cooling by forced air or water can be provided, but this arrangement causes other problems.

2. Description of the Prior Art.

U.S. Pat. No. 4,993,148 to Adachi et al. describes a method for forming a circuit board that involves plating conductor layers on a pre-defined dielectric layer that leaves a portion of the conductor exposed for mounting components. This method does not involve applying a copper foil, defining a conductor and via pattern in the copper foil and then using the conductor and via pattern to define the dielectric.

U.S. Pat. No. 4,999,740 to Ilardi et al. describes a circuit board made by building layer of photo-imageable dielectric material on a metal substrate and imaging the dielectric to create wells for mounting components on the metal substrate. It does not involve multiple wiring layers, and it does not provide voltage planes of high current carrying capacity or utilize laminated metal foil as a dielectric removal mask.

U.S. Pat. No. 5,081,562 to Adachi et al. describes a circuit board with a metal plate on which a photo-sensitive insulating layer is formed leaving portions of the metal plate exposed for component mounting areas. The circuit board requires copper plating of conductors and vias. It does not contain soldered interconnections of individual layers.

While the structural arrangements of these prior art circuit boards at first appearance have similarities with the circuit card of the present invention, they differ in material respects. These differences will be understood more clearly from a reading of the following detailed description of the invention, and these differences admit of significant advantages in the manufacturing process and in the use of the completed circuit card.

By way of example, the present invention permits a very cost efficient manufacturing process to be used, namely, the elimination of copper plating of conductors and the elimination of copper plating usually required for all interconnects. This advantage is even more significant in the manufacture of power circuit cards that involve thicker copper and take more manufacturing time.

A further advantage that is significant with the circuit card arrangement of the present invention is in its elimination of the usual requirement of copper plating, which permits higher wiring densities to be obtained. A still further advantage that is available with the present invention over the prior art is in the isolation of the primary and secondary voltage planes that produce improved electrical performance and a reduction in cost.

Yet another advantage of the present invention is obtained by the use of thin coatings for the materials of high dielectric breakdown strength, which thin materials also provide a minimal thermal resistance. When used in conjunction with openings in the dielectric for component mounting, an effective heat dissipating circuit card structure results.

Accordingly, the prior art patents identified above are hereby incorporated by reference.

OBJECTS AND SUMMARY OF THE INVENTION

It is a principal object of the present invention to provide a new and improved circuit card that overcomes deficiencies inherent in prior card arrangements.

It is also an object of the invention to provide a new and improved method of manufacturing the circuit card of the invention.

Briefly a circuit card constructed and arranged in accordance with the principles of the present invention includes a carrier or substrate formed of a metal material with a dielectric material of 0.002 inch or less formed on at least one surface to support an electric circuit of a predetermined configuration. Selected areas of the circuit and the dielectric have portions removed for mounting components called for by the circuit arrangement and operating requirements. A unique metallic land configuration provides a self-aligned interconnect via by acting as a develop mask during the dielectric removal process.

The above and other objects, advantages and features of the present invention will become more readily apparent from the following detailed description of the presently preferred embodiment as illustrated in the accompanying drawings.

BRIEF DESCRIPTION OF THE DRAWINGS

FIG. 1 is a view of an arrangement of a multi-layered circuit card primarily for a voltage conversion operation in accordance with the present invention.

FIG. 2 is a view of a circuit card in accordance with the present invention as it is to be used primarily for a voltage boost circuit arrangement in accordance with the invention.

DETAILED DESCRIPTION OF THE INVENTION

Figure 3:
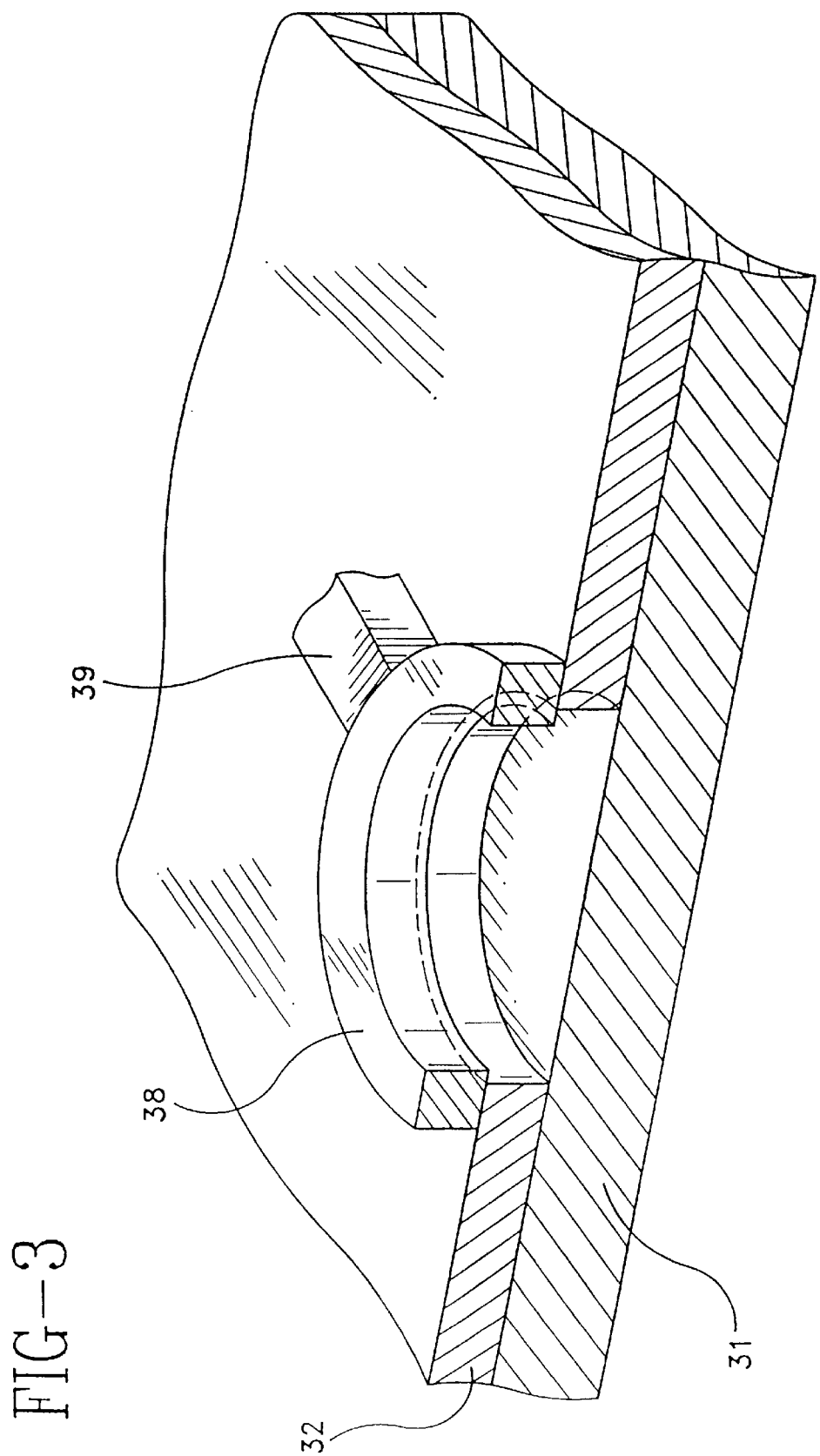
FIG. 3 is a perspective view in elevation partly in cross section illustrating the unique configuration of a metallic land for functioning as a develop mask.

In FIG. 1 of the drawings, the numeral 10 identifies, generally, an isolated voltage convertor card in accordance with the invention. The card 10 features a metal carrier 11 on which a first, thin, dry film dielectric layer 12 is formed and dried or cured.

For the first, dry film dielectric layer 12, an acceptable alternative has been found to be a liquid dielectric that is screen printed and dried on the surface of the metal carrier 11. The thickness of the first dielectric layer 12, to provide the required insulation at 2500 volt, is a thickness of approximately 0.002 inch.

This dielectric thickness provides for the use of a material with relatively poor thermal conductivity properties, as low as 0.2 watts per meter-degree Kelvin, while still providing minimal application thermal resistance of less than 3 degrees C. per watt. As will become clear as the description proceeds, the application thermal resistance is reduced to 0.5 degrees C. per watt, or less, by selective removal of the dielectric material.

On the first dielectric layer 12, a first copper foil 13 of about 2 oz. is laminated by the application of temperature and pressure in a lamination press. It is during the lamination that the first copper foil 13 is adhered to the dielectric material and the dielectric material becomes cured.

It is contemplated that the first copper foil 13 will be formed into circuit lines of a desired pattern by a conventional subtractive etching process to form, for example, a first voltage source and a second voltage source, indicated as primary voltage and secondary voltage in FIG. 1 of the drawings and signal circuit lines 13a and 13b also in FIG. 1.

A second dielectric layer 14 of a photo-imageable dielectric material covers the first copper foil 13 after it has been etched and the desired number of circuits have been formed. A vacuum laminator has been found to be the better applicator for applying the second dielectric layer 14, since it is important in the manufacturing process that fabrication costs be controlled.

Actually, the second dielectric layer 14, when it is formed in accordance with the invention, will be dried, then exposed, developed and cured in a pattern that leaves dielectric material between the circuit lines formed in the first copper foil 13. Forming the second dielectric layer 14 in accordance with the method of this invention removes dielectric material from the top surface of the circuit lines in the first copper foil layer 13, thereby forming a planar surface on which components may be mounted, additional circuit lines formed and connections may be made, as will be described.

A modification of the process for applying the second dielectric layer 14 is to pattern screen print a liquid dielectric material directly between the circuit lines in the copper foil layer 13. The pattern screen printing process eliminates the expose and develop process steps required when a film dielectric material is used.

A third dielectric layer 29 is applied to the planarized structure, followed by lamination of a second copper foil layer 19.

For example, a portion of the third dielectric layer 29 is removed, as indicated at 15, to permit a component part 16 to be connected directly with the secondary voltage circuit formed in the first copper foil 13. Now, a connection is able to be made by the wire 17 from the component part 16 over to a circuit line 18 that is formed in a second copper foil 19 that is laminated on the third dielectric layer 29 like the first copper foil 13 was applied to the first dielectric layer 12.

The circuit lines indicated by the numerals 20a and 20b can be parts of the same circuit, or they can be completely different and separate circuits. It is illustrated in FIG.1 that different component parts 21 and 22 can be connected to the circuit lines 20a and 20b.

It is significant to note that the structural arrangement in accordance with the invention permits the electrical connections 23, 24, 25, 26, 27 and 28 to be made by reflow solder. Therefore, there is a substantial saving in cost, and there is a material saving in making troublesome connections substantially easier.

Referring next to FIG. 2 of the drawings, a different arrangement is illustrated by a circuit card identified generally by the numeral 30. One difference between this card 30 and the card 10 illustrated in FIG. 1 is that there is no second dielectric layer applied over the etched copper foil layer, since the voltage features are contained in the same copper foil layer as the signal circuit lines on this card 30.

To describe this aspect of the invention, the circuit card 30 includes a carrier 31 formed of a suitable metal, such as copper, to function as a ground or common, while also functioning as a heatsink. A photo-imageable dielectric material 32 is applied to the top surface of the carrier 31 and dried.

A copper foil 37 of a required thickness is applied to the dielectric material 32 in a lamination press using just sufficient pressure to adhere the copper foil to the dielectric material. The temperature during this lamination process is kept sufficiently low so as not to cure the dielectric material.

As done with the card 10, FIG. 1, a desired circuit pattern is formed in the copper foil 37 on the carrier 31 in FIG. 2 by using a conventional subtractive etching process. The dielectric material 32 is exposed to a required pattern that can include electrical interconnect vias 33, thermal vias (not illustrated) and component mounting openings, such as illustrated by the numeral 34 for attaching a part 35 by solder 36, as needed for a particular circuit for which this card is made.

The circuit card 30, like any circuit card, is processed through a solution to remove selectively areas of the dielectric material 32 that are unexposed or uncovered. Now the card 30 is subjected to a temperature for sufficient time to cure the dielectric material 32 that remains.

FIG. 3 illustrates a donut shaped configuration for a copper land 38, in accordance with the present invention, that permits the use of reflow solder to interconnect between circuit points or component parts and the metal carrier 31. A circuit line 39 connects any other desired component part or circuit point with the metal carrier 31, so that the advantages described, supra, can be realized.

A principal advantage of the donut shaped configuration for the copper land 38 is obtained through its use as a develop mask during the dielectric removal process. By this means, the copper land 38 provides a self-aligned interconnect via structure.

Both of the circuit cards 10 and 30 utilize a photo-imageable dielectric material that provides good strength against voltage breakdown, such as greater than 1250 volts per mil, so that the dielectric is applied in a thin layer with good thermal dissipation characteristics.

An important feature in the manufacturing process described is that all interconnections are created without the need for drilling or copper plating. In other words, all interconnections, according to the present inventive method of manufacture, are made with reflow solder as a part of the manufacturing process.

Also, if desired for a particular situation, a layer of a suitable dielectric material can be applied as an alternative to the use of copper foil directly on the metal carrier and the subtractive etching processes that it requires. In this situation, such a dielectric layer must be photo-patterned, cured, have its surface roughened and plated with copper.

A circuit card produced in accordance with the present invention is effective in isolating voltages and has power (heat) dissipation capabilities that eliminate an external heatsink. High density layer to layer and circuit point to point interconnections are made without a need for copper plating, drilling or other mechanical operations that take time and increase cost.

Carriers with thin dielectric layers provide excellent thermal dissipation characteristics for heat generating components. Also, by the use of dielectric material with selective removal characteristics permit such heat generating components to be attached directly to, or at least closer to, the metal carrier which is effective as a heatsink.

The compact arrangement of a circuit card according to the invention, whether the card is a voltage boost card, an isolated voltage conversion card or other function requiring high heat dissipation, is enhanced substantially by the donut land configuration that permits solder interconnections to achieve further reduction in cost of manufacture. The donut land, of course, can be preformed and applied where needed either by heat or by solder, and the circuit line 39 can be in the form of a wire that is preformed with the donut land for connection as required.

The invention has been described in substantial detail. It is understood that changes and modifications can be made without departing from the spirit and scope of the invention which is set forth in the following claims.

What is claimed is:

1. A method of manufacturing a multi-layer circuit package, comprising the steps of:

providing a metal substrate as a carrier with a surface treated to receive a layer of a predetermined material;

applying a predetermined liquid film or a dry film dielectric material to said treated surface of said metal substrate;

laminating copper foil material to said dielectric material under controlled heat and pressure;

defining conductor and via patterns in said laminated copper foil material;

dissolving said dielectric material within an area defined by predetermined vias to form an opening;

curing said dielectric material layer on said metal substrate;

applying solder paste to component mounting lands and vias; and locating components on component mounting lands on said solder paste, and reflowing said solder paste.

2. A method as described by claim 1 further comprising the steps of sequentially adding a plurality of dielectric and electrically conductive layers in an alternating sequence, and defining said predetermined areas for dissolving to form vias by using donut configured lands with said reflow solder paste.

3. A method as described by claim 2 further comprising the step of applying reflow solder to those areas defined by said donut configured lands and to other lands to provide a securely attached circuit card package.

4. A process for manufacturing multi-layer circuit boards, comprising:

forming thin metal plates including a base of copper;

depositing coatings of curable dielectric directly onto the metal plates;

forming wiring layers on the curable dielectric including donut shaped lands with open centers;

using a plurality of the donut shaped lands as masks to form holes defined by the open centers and extending through the curable dielectric;

depositing a conductive material in the holes to interconnect the respective lands with the metal plate; and curing the dielectric.

5. The process of claim 4 in which the dielectric is deposited by laminating a dry partially cured film to the metal plate and the wiring layer and holes are formed after the film is deposited, but before fully curing the dielectric film.

6. The process of claim 4 in which the dielectric is a photo-imageable epoxy and the step of forming holes includes exposing the epoxy under the centers of the holes to electromagnetic radiation and dissolving the exposed epoxy to form the holes through the donut centers to the plates.

7. The process of claim 4 further comprising the steps of: producing a plurality of circuit boards; and testing the process by testing one or more boards by applying 3,000 or more volts between the metal plate and one or more conductors on the wiring layer which are not connected to the donut shaped lands interconnected to the metal plate.

8. The process of claim 4 in which, the step of depositing conductive material into the holes includes screening solder paste into the holes, and solder paste is also screened onto a plurality of the donut shaped lands and onto other lands, and further comprising the steps of: positioning surface mount components onto the circuit boards with leads in the solder paste; heating the circuit boards to reflow the solder paste to simultaneously interconnect the donut-shaped lands to the metal plate with a solder metal alloy and to solder the component leads to the lands; and cooling the circuit boards.

* * * * *